(12) United States Patent
Nozawa et al.

(10) Patent No.: US 7,132,020 B2
(45) Date of Patent: Nov. 7, 2006

(54) SOLDER FOR USE ON SURFACES COATED WITH NICKEL BY ELECTROLESS PLATING

(75) Inventors: Iwao Nozawa, Mouka (JP); Takashi Hori, Utsunomiya (JP); Daisuke Soma, Tochigi (JP); Takahiro Roppongi, Tochigi (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 488 days.

(21) Appl. No.: 10/668,377

(22) Filed: Sep. 24, 2003

(65) Prior Publication Data

US 2004/0126269 A1 Jul. 1, 2004

(30) Foreign Application Priority Data

Sep. 25, 2002 (JP) .............................. 2002-278476

(51) Int. Cl.
*B23K 1/00* (2006.01)
(52) U.S. Cl. ...................... 148/400; 420/559; 420/562
(58) Field of Classification Search ................ 148/400; 420/559, 562
See application file for complete search history.

(56) References Cited

U.S. PATENT DOCUMENTS

| 6,033,488 A | 3/2000 | An et al. ........................ 148/24 |
| 6,307,160 B1 | 10/2001 | Mei et al. ..................... 174/256 |

FOREIGN PATENT DOCUMENTS

| EP | 0652072 | 5/1995 |
| JP | 11000791 | * 1/1999 |
| JP | 11267880 | * 10/1999 |

OTHER PUBLICATIONS

Shi-Wei Ricky Lee et al, "Assessment on the Effects of Electronless Nickel Plating on the Reliability of Solder Ball Attachment to the Bond Pads of PBGA Substrate", 2000 Proceedings, 50th Electronic Components and Technology Conference, ECTC 2000, Las Vegas, May 21-24, 2000. Proceedings of the Electronic Components and Technology Conference, New York; IEEE US, vol. Conf. 50, May 21, 2000 pp. 868-873.

Zequn Mei et al, "Brittle Interfacial Fracture of PBGA Packages Soldered on Electroless Nickel/Immersion Gold", Electronic Components & Technology Conference, 1998, 48th IEEE Seattle, Wa. May 25-28, 1998, New York, IEEE, US May 25, 1998, pp. 952-961.

Patent abstracts of Japan, vol. 1999, No. 04, Apr. 30, 1999, Abstract of JP 11-00791 A, published on Jan. 6, 1999.

Patent Abstracts of Japan, vol. 1995, No. 11, Dec. 26, 1995, Abstract of JP 07-195189 A, published on Aug. 1,1995.

Patent Abstracts of Japan, vol. 2000, No. 13, Feb. 5, 2001, Abstract of JP 2000-277895 A, published on Oct. 6, 2000.

* cited by examiner

*Primary Examiner*—Sikyin Ip
(74) *Attorney, Agent, or Firm*—Michael Tobias

(57) ABSTRACT

A solder which can form a soldered joint of good bonding strength on a Ni layer containing a small amount of P formed from electroless Ni plating with a P-containing plating solution comprises 60–64 mass % of Sn, 0.002–0.01 mass % of P, 0.04–0.3 mass % of Cu, and a remainder of Pb. The solder is particularly suitable for forming a solder bump on a Cu electrode which has been coated with Ni by electroless plating.

9 Claims, 3 Drawing Sheets

SOLDER FOR USE ON SURFACES COATED WITH NICKEL BY ELECTROLESS PLATING

TECHNICAL FIELD

The present invention relates to a solder which is particularly suitable for soldering portions which are coated with nickel by electroless plating and thus contain a small amount of phosphorus.

BACKGROUND ART

Portions to be soldered, such as electrode pads which are formed on the surface of a substrate of an electronic part such as a BGA (ball grid array) package or on the surface of a printed circuit board (PCB), are often made of copper (Cu), since Cu is wettable by molten solder as easily as are noble metals such as gold (Au) and silver (Ag) and it is much less expensive than these noble metals. However, there are cases in which the advantage of Cu that it has good wettability by molten solder is developed excessively so that the formation of an intermetallic compound of Cu with Sn (contained in the solder) takes place during soldering more than is required for the solder to form soldered joints of sufficient bonding strength. The formation of such an intermetallic compound, which is inherently brittle, continues to develop even during aging of the soldered joints.

Therefore, when Cu is used to form portions to be soldered such as electrode pads, it is found that soldered joints formed on such portions are susceptible to brittle fracture due to the formation of a Cu—Sn intermetallic compound in an excessive amount.

In contrast, as is well known to those skilled in the art, if nickel (Ni) is used to form portions to be soldered and soldering is performed under appropriately controlled conditions, it is possible to attain sufficient wettability by molten solder while the amount of an intermetallic compound formed is controlled to a reasonable level required to provide the resulting soldered joints with sufficient bonding strength. However, due to the cost advantage of Cu that it is less expensive than Ni, Cu is preferred as the most versatile nonferrous conductive metal in many applications including electronic parts.

In order to exploit the advantages of Cu and Ni together, substrates for electronic parts having portions to be soldered which are made of Cu and coated with Ni by plating have recently been employed increasingly. Thus, portions to be soldered such as electrode pads have a body of Cu, and only their surface which must be wetted by molten solder is formed by Ni plating so as to prevent the formation of an intermetallic compound in an excessive amount.

Ni plating can be performed either by electroplating or electroless plating. Electroplating forms a metal layer on the surface of a cathode by an electrolytic reaction. When a substrate such as a substrate of a BGA package or of a PCB is subjected to electroplating to form a Ni layer on portions to be soldered (i.e., electrode pads) of the substrate, there are many problems such as the necessity of electrical connection to each of the tiny electrode pads so as to allow them to act as cathodes, a limitation on the current density for electrolysis, and corrosion of metallic portions in a plating bath. A soluble anode, which is burdensome in replacement when it has been consumed and which is wasteful since it cannot be consumed completely, is generally used in electroplating with Ni. Furthermore, the rate of Ni deposition by electroplating is not uniform, and it is decreased particularly in those areas which are far from the anode or which form recesses.

In contrast, electroless Ni plating is advantageous in that a Ni layer having a uniform thickness can be formed, regardless of the type or shape of a material to be plated, by merely immersing the material in a plating solution without passing an electric current therethrough. Therefore, electroless plating is predominantly employed in Ni plating of substrates.

A typical plating solution which is used in electroless Ni plating is a solution called a Ni—P plating solution, which contains nickel sulfate as a Ni ion source and sodium hypophosphite as a reducing agent. An Ni—P plating solution also contains sodium hydroxide to maintain the pH of the solution at a predetermined value. A nickel coating formed by electroless plating with a Ni—P solution usually contains phosphorus (P) in an amount of 2–15 mass %.

After a substrate of a BGA package (hereunder referred to as a BGA substrate) is subjected to electroless Ni plating to form a Ni layer on the electrode pads of the substrate, flash plating with Au is applied in most cases in order to protect the Ni-plated layer from a chemical reaction such as oxidation and improve the wettability by or affinity for molten solder. Thereafter, solder bumps are formed on the Ni-plated electrode pads of the BGA substrate. When the BGA package is mounted on a PCB (printed circuit board), the solder bumps are allowed to melt to solder the BGA substrate to the PCB. The PCB also has electrode pads, which are typically made of Cu. The Cu electrode pads of the PCB may also be plated with Ni, and the resulting Ni layer may be subjected to flash plating with gold or another noble metal.

The formation of solder bumps on the electrode pads of a BGA substrate is performed by a process comprising applying a sticky flux to the electrode pads, then placing a solder ball on each electrode pad, and heating the BGA substrate having the solder ball on each electrode pad in a reflow furnace at a temperature sufficient to melt the solder ball and convert it into a solder bump bonded to the electrode pad.

The solder balls used to form solder bumps on a BGA substrate are generally made of a solder having a composition which is close to an Sn—Pb eutectic alloy, i.e., a composition consisting essentially of 60–64 mass % of Sn and a remainder of Pb. Such a eutectic or nearly eutectic Sn—Pb solder has a relatively low melting point of at most 190° C., so it is possible to minimize thermal effect on the BGA substrate and the electronic device mounted on the substrate during heating to form the solder bumps and/or subsequent heating for soldering the substrate to a PCB. Another advantage of the Sn—Pb alloy is that it generally exhibits good wetting power.

When solder bumps made of the eutectic or nearly eutectic Sn—Pb solder are formed by the above-described process on Ni-plated electrode pads which have been treated by flash plating with Au, it is expected that in the final heating step in the process, the solder balls which have melted can wet the underlying electrode pads smoothly and form solder bumps firmly secured to the electrode pads due to the Ni plating and flash Au plating and in view of the nature of the solder.

In fact, however, with electronic products having assembled therein a PCB on which a BGA package having solder bumps formed in this manner on its substrate is mounted, the BGA substrate is sometimes detached from the PCB by accident. For example, electronic products such as cellular phones and notebook computers may receive mechanical shocks when a cellular phone put in a pocket of ones clothing slips out of the pocket or when one drops a bag containing a notebook computer from his grasp. In such situations, detachment of soldered joints formed from the above-described solder bumps to connect the BGA substrate to the PCB may occur, leading to failure of electrical connection between these two parts and malfunction of the electronic product.

SUMMARY OF THE INVENTION

The present invention provides a solder capable of forming firmly bonded soldered joints on electrode pads of a substrate for an electronic part or a PCB which have been plated with Ni by electroless plating using a Ni—P plating solution, i.e., a phosphorus-containing plating solution. As a result, even if mechanical shocks are applied to an electronic product in which the electronic part or PCB is incorporated, the soldered joints are not detached easily from the Ni-plated electrode pads, thereby improving the reliability of the soldered joints and hence of the electronic product.

According to one aspect of the present invention, a solder suitable for use in soldering to a surface coated with nickel by electroless plating with a phosphorus-containing plating solution comprises 60–64 mass % of Sn, 0.002–0.01 mass % of P, 0.04–0.3 mass % of Cu, and a remainder of Pb.

The present invention also provides a soldered joint, solder ball, or solder bump formed from the solder, and a BGA substrate having solder bumps formed from the solder.

DETAILED DESCRIPTION OF THE INVENTION

The present inventors observed the surfaces formed by detachment of a solder joint in bump form of a conventional Sn—Pb solder from a Ni-plated surface formed by electroless Ni plating and found that no solder remained on the Ni-plated surface, so the Ni-plated surface was extremely flat. Upon observation of a cross section of such a detached soldered joint under a microscope and chemical analysis of the cross section of the joint by an X-ray microanalyzer, it was found that a layer of an Si—Ni intermetallic compound was formed on the detached surface of the soldered joint, with P being locally concentrated in the layer so as to form a sub-layer having a higher concentration of P (hereunder such sub-layer being referred to as a high-P sub-layer).

Figure 1:
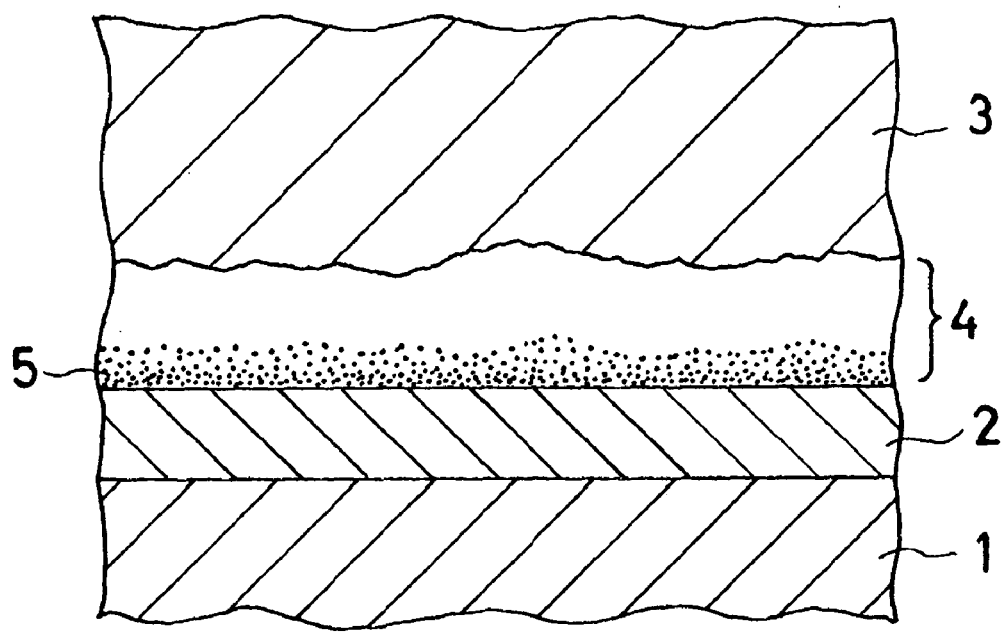
FIG. 1 is a schematic diagram showing in cross section the structure in the vicinity of the joining area when a soldered joint is formed with a conventional Sn—Pb solder on a Cu electrode pad which has been plated with Ni by electroless plating.

FIG. 1 is a schematic diagram showing in cross section the structure in the vicinity of the joining area of a soldered joint of a conventional Sn—Pb solder which is formed on a Cu electrode pad of a BGA substrate in which the Cu pad has been plated with Ni by electroless plating with a P-containing or Ni—P plating solution.

On an electrode pad 1 made of Cu formed on a BGA substrate (not shown), a Ni coating 2 is formed by electroless plating. The Ni coating 2 is soldered with an Sn—Pb solder 3. During heating for soldering to allow the solder 3 to melt, interdiffusion or mutual diffusion occurs between the Sn—Pb solder and Ni to form a layer 4 of an Sn—Ni intermetallic compound. The Ni coating 2 formed by electroless plating contains P (phosphorus), and this phosphorus is concentrated in the Sn—Ni intermetallic compound layer 4 to form an Si—Ni—P intermetallic compound. As a result, in the Sn—Ni intermetallic compound layer 4, which is inherently brittle, a high-P sub-layer 5 of the Si—Ni—P intermetallic compound, which has a still higher tendency toward brittleness, is formed adjacent to the Ni coating 2. The high-P sub-layer 5 formed in the Sn—Ni intermetallic compound layer 4 weakens the metallic bond of the soldered joint and causes the soldered joint of an Sn—Pb solder to be readily detached when a mechanical shock is applied. Thus, a soldered joint of an Sn—Pb solder formed on a surface coated with Ni by electroless plating tends to be easily detached upon application of a shock.

A solder according to the present invention is based on a solder composition of 60–64 mass % of Sn and a remainder of Pb, and it further contains 0.002–0.01 mass % of P and 0.04–0.3 mass % of Cu.

The solder according to the present invention has a good wetting power and a relatively low melting point of at most 190° C. due to its base composition of 60–64 mass % of Sn and a remainder of Pb, which is in the vicinity of a eutectic Sn—Pb alloy. Therefore, it is possible to avoid thermal effects on a BGA substrate and an electronic device packaged in the substrate during heating to form solder bumps on the BGA substrate and subsequent heating for soldering a BGA package to a PCB.

The addition of minor amounts of P and Cu together to the base Sn—Pb solder is effective in suppressing the formation of an Sn—Ni intermetallic compound and providing the solder with an improved strength. It also has an effect of minimizing concentration of P into an Sn—Ni intermetallic compound layer from a Ni coating formed by electroless plating.

If the amount of P which is present in the solder is less than 0.002 mass %, it is difficult to attain the effect of suppressing the formation of an Sn—Ni intermetallic compound and the concentration of P from the underlying Ni coating formed by electroless plating. If P is present in an amount of more than 0.01 mass %, not only does the solder have a deteriorated solderability, but also it forms a soldered joint having many voids therein. Preferably, the amount of P is 0.004–0.008 mass %.

Like P, Cu also serves to suppress the formation of Si—Ni intermetallic compound. In addition, Cu has an effect of redressing the brittle nature of an Sn—Ni intermetallic layer formed at the interface of a soldered joint by the action of Cu which is incorporated in the layer in a minor amount. These effects cannot be expected if the amount of Cu which is present in the solder is less than 0.04 mass %. The addition of Cu in an amount of more than 0.3 mass % leads to an appreciable elevation in the liquidus temperature of the solder, which causes the formation of voids. The addition of Cu in such a large amount is also undesirable since it causes the formation of an Sn—Cu intermetallic compound in solder bumps. Preferably, the amount of Cu is 0.06–0.2 mass %.

Figure 2:
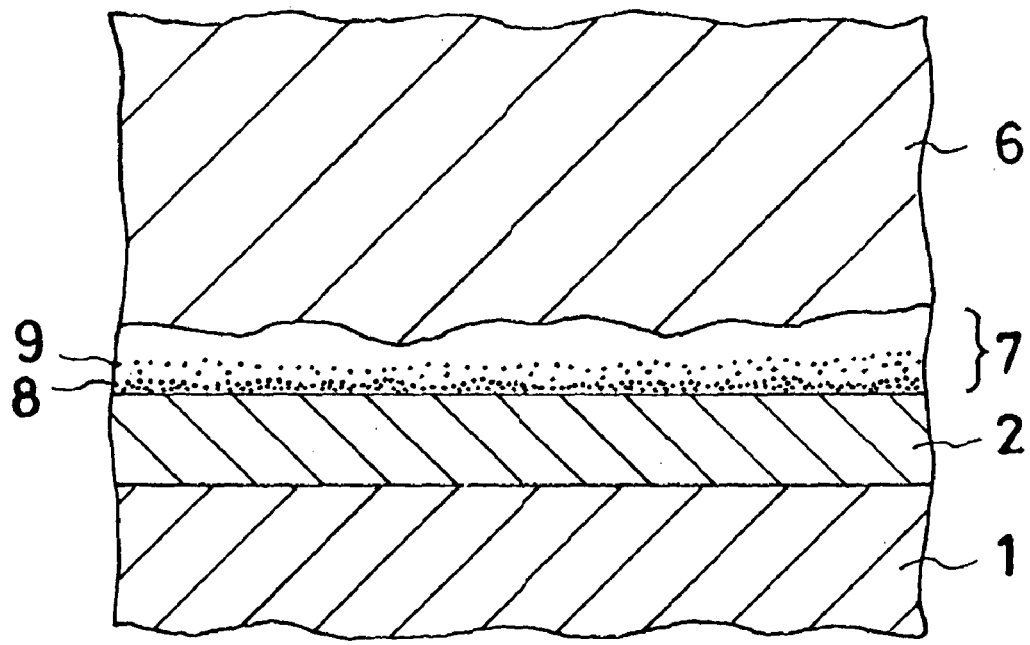
FIG. 2 is a schematic diagram similar to FIG. 1 when a soldered joint is formed with a solder according to the present invention.

FIG. 2 schematically shows the structure of a soldered joint formed from a solder according to the present invention on a Cu electrode pad of a BGA substrate in which the Cu electrode has been plated with Ni by electroless plating. The soldered joint is more resistant to detachment when a mechanical shock is applied.

In FIG. 2, a Cu electrode pad 1 formed on a BGA substrate (not shown) is coated with a P-containing Ni coating 2 formed by electroless plating. The Ni coating 2 is soldered with a solder 6 according to the present invention. During soldering, Ni in the Ni coating 2 reacts with Sn and Cu in the solder 6 to form an Sn—Ni—Cu intermetallic compound layer 7 at the interface between the Ni coating 2 and the solder 6. Due to the composition of the solder 6 in which P and Cu are added to suppress the formation of such an intermetallic compound, the Sn—Ni—Cu intermetallic compound layer 7 is thinner than the Sn—Ni intermetallic compound layer 4 in FIG. 1 in which a conventional Sn—Pb solder is used. The brittle nature of the Sn—Ni—Cu intermetallic compound layer 7 is improved by incorporation of a small amount of Cu in the layer. Diffusion of P into the Sn—Ni—Cu intermetallic layer 7 from the P-containing Ni coating 2 during soldering is also suppressed by the action of P and Cu in the solder 6. As a result, an extremely thin sub-layer 8 of an Sn—Ni—P intermetallic compound having a relatively high P concentration is formed adjacent to the Ni coating 2, and a thin sub-layer 9 of an Sn—Ni—P intermetallic compound having a relatively low P concentration is formed atop the sub-layer 8.

Thus, when a Ni surface formed by electroless plating is soldered with a solder according to the present invention, the formation of an Sn—Ni intermetallic compound, which forms a brittle layer, is suppressed, and the thickness of this brittle Sn—Ni intermetallic compound layer is decreased. In addition, the formation of an Sn—Ni—P intermetallic compound, which forms a still more brittle high-P sub-layer in the Sn—Ni intermetallic compound layer, is also significantly suppressed. Therefore, soldered joints formed from the solder are not easily detached even when a mechanical shock is applied to an electronic product in which the soldered joints are used.

As described above, a solder according to the present invention is suitable for soldering on a surface having a Ni coating formed by electroless plating (and thus containing a small amount of P). The form of the solder is not limited to solder balls, and the solder may be in various forms including solder balls, solder paste, preformed solder, wire solder, and flux-cored wire solder.

Solder balls can be produced from a solder according to the present invention by various methods, which include (1) a method in which relatively large solder particles obtained through the centrifugal atomization method or the gas atomization method are remelted in alumina powder to make the particles spherical, (2) a method in which a thin solder wire is accurately cut into small pieces of the same length and the small pieces are then made spherical by remelting in an oil bath, and (3) a method involving dripping drops from a narrow nozzle.

EXAMPLES

Various Sn—Pb based solders of Examples 1 to 7 and Comparative Examples 1 to 3 having the compositions shown in Table 1 were prepared, and solder balls having a diameter of 0.76 mm were produced from each solder by the above-described method (2).

The bonding strength of a soldered joint formed from each solder on a Ni coating formed by electroless plating was tested in the following manner.

Testing Method

A BGA substrate having electrode pads made of Cu and coated with Ni by electroless plating with a Ni—P plating solution was used for testing. After a rosin-based sticky flux was applied to the electrode pads of the BGA substrate, the above-described solder balls of a solder to be tested were mounted on the electrode pads. The BGA substrate having the solder balls mounted thereon was heated in a reflow furnace in air with a peak heating temperature of 210° C. to cause the solder balls to melt and thus form themselves into solder bumps.

Figure 3:
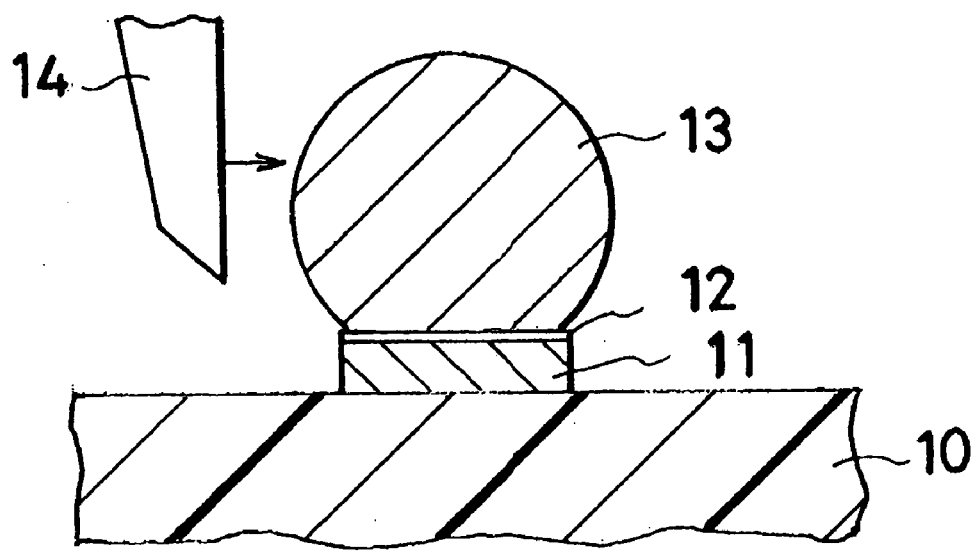
FIG. 3 illustrates the manner of applying a force to detach a solder bump formed on a Ni-plated Cu electrode pad of a BGA substrate in a test for evaluating the bonding strength of the solder bump.

FIG. 3 shows a solder bump formed in this manner. In FIG. 3, a BGA substrate 10 has an electrode pad 11 made of Cu, which is coated with a Ni layer 12 formed by electroless plating. A solder bump 13 is formed on the electrode pad, so the solder bump 13 contacts the Ni layer 12 formed by electroless plating and thus containing a small amount of P.

Subsequently, the BGA substrate was firmly held by a suitable jig. Then, as shown in FIG. 3, a lateral force was applied to the solder bump 13 by pushing the bump with an appropriate tool 14 in a manner causing the solder bump 13 to detach or fracture. In this case, the force was applied almost horizontally and in parallel with the bonded surface of the solder bump. Alternatively, the force to detach or fracture a solder bump may be applied vertically by firmly gripping the solder bump with an appropriate clamp and then pulling it upward.

Figure 4:
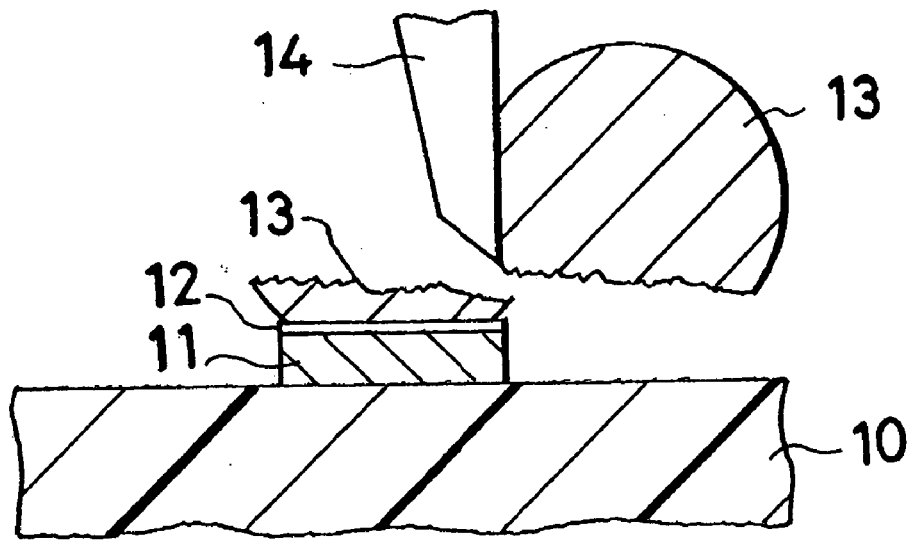
FIG. 4 illustrates a fracture caused by the test shown in FIG. 3 in which the fracture occurs within the solder bump.

The fractured surface formed on the BGA substrate was then observed to determine the mode of fracture, which was classified as one of the following three modes:

Mode 1: Fracture occurred within the solder bump 13, as shown in FIG. 4.

Figure 5:
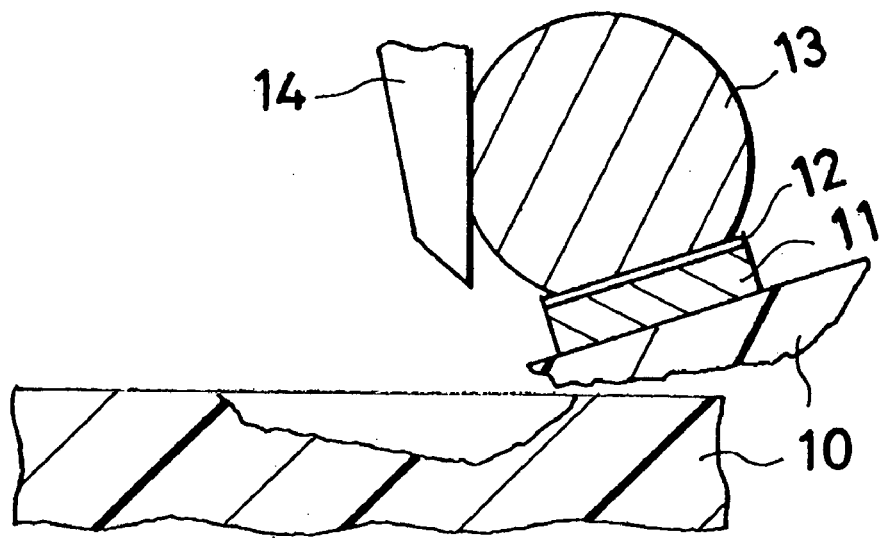
FIG. 5 illustrates a fracture caused by the test shown in FIG. 3 in which the fracture occurs within the BGA substrate.

Mode 2: Fracture occurred within the body of the BGA substrate 10, with the solder bump 13 being detached from the substrate 10 while remaining attached to the electrode pad 11 through the Ni layer 12, as shown in FIG. 5.

Figure 6:
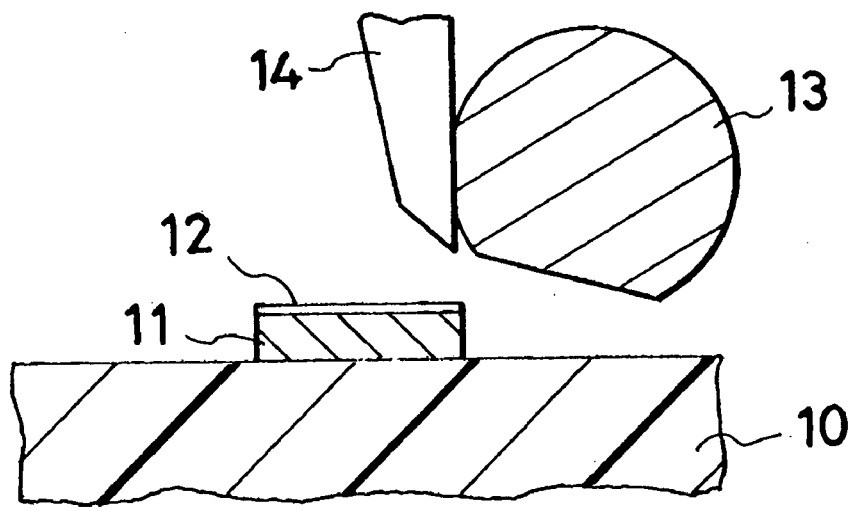
FIG. 6 illustrates a fracture caused by the test shown in FIG. 3 in which the fracture takes the form of detachment of the solder bump from the electrode pad of the BGA substrate.

Mode 3: Fracture occurred near the interface between the solder bump 13 and the Ni layer 12, as shown in FIG. 6.

Fracture of mode 1 or mode 2 indicates that the solder bump was firmly bonded to the Ni layer with a bonding strength sufficient to make it difficult for the bump to detach therefrom. On the other hand, fracture of mode 3 indicates that the bonding strength of the solder bump was not sufficient, so the solder bump was easily detached from the Ni layer. A fractured surface of mode 3 is flat, whereas a fractured surface of mode 1 or mode 2 is irregular. Therefore, fractures of mode 3 can be clearly distinguished from fractures of mode 1 or 2.

One hundred (100) solder bumps selected at random on each BGA substrate having solder bumps made of the same solder were tested in the above-described manner, and the mode of fracture of each solder bump was determined. The bonding strength of the solder to a Ni surface formed by electroless plating was evaluated by the number of fractures of mode 1 or 2 (sufficient bonding strength) among the 100 fractures as follows:

Good: 80 or more fractures were mode 1 or 2 (20 or less fractures were mode 3);

Poor: Less than 80 fractures were mode 1 or 2 (more than 20 fractures were mode 3).

The test results are shown in Table 1 below along with the composition of the solder.

TABLE 1

| | Composition of solder (mass %) | | | | Test Result |
|---|---|---|---|---|---|
| | Pb | Sn | P | Cu | |
| Example 1 | Balance | 63 | 0.004 | 0.06 | Good |
| Example 2 | Balance | 63 | 0.01 | 0.06 | Good |
| Example 3 | Balance | 63 | 0.006 | 0.1 | Good |
| Example 4 | Balance | 60 | 0.006 | 0.1 | Good |
| Example 5 | Balance | 64 | 0.006 | 0.1 | Good |
| Example 6 | Balance | 63 | 0.004 | 0.2 | Good |
| Example 7 | Balance | 63 | 0.01 | 0.2 | Good |
| Comp. Example 1 | Balance | 63 | — | — | Poor |
| Comp. Example 2 | Balance | 63 | 0.006 | — | Poor |
| Comp. Example 3 | Balance | 63 | — | 0.06 | Poor |

As can be seen from Table 1, all the solders of Examples 1 to 7 according to the present invention exhibited good bonding strength on a P-containing Ni layer formed by electroless plating. Therefore, they can form a reliable soldered joint on a Cu electrode pad coated with Ni by electroless plating, and the soldered joint will be difficult to detach even if a mechanical shock is applied to an electronic product in which the soldered joint is used.

On the other hand, none of the solders of Comparative Examples 1 to 3 in which one or both of P and Cu was not added had good bonding strength on a P-containing Ni layer formed by electroless plating.

What is claimed is:

1. A solder for use in soldering to a surface coated with nickel by electroless plating with a phosphorus-containing plating solution, consisting of 60–64 mass % of Sn, 0.002–0.01 mass % of P, 0.04–0.3 mass % of Cu, and a remainder of Pb.

2. A solder as claimed in claim 1 which is in the form of a solder ball, a solder paste, preformed solder, wire solder, or flux-cored wire solder.

3. A soldering method comprising soldering the solder claimed in claim 1 to a surface coated with nickel by electroless plating with a phosphorus-containing plating solution.

4. A soldered joint comprising the solder claimed in claim 1 formed on a surface coated with nickel by electroless plating with a phosphorus-containing plating solution.

5. A method of forming a solder bump comprising heating a solder ball comprising the solder claimed in claim 1 on a surface coated with nickel by electroless plating with a phosphorus-containing plating solution.

6. A solder bump comprising the solder claimed in claim 1 formed on a surface coated with nickel by electroless plating with a phosphorus-containing plating solution.

7. A substrate for a ball grid array package including a plurality of solder bumps comprising the solder claimed in claim 1 disposed on Cu electrode pads coated with nickel by electroless plating with a phosphorus-containing plating solution.

8. A solder as claimed in claim 1 containing 0.004–0.008 mass % of P.

9. A solder as claimed in claim 1 containing 0.06–0.2 mass % of Cu.

* * * * *